United States Patent [19]

Nishihara et al.

[11] Patent Number: 5,266,746
[45] Date of Patent: Nov. 30, 1993

[54] FLEXIBLE PRINTED CIRCUIT BOARD HAVING A METAL SUBSTRATE

[75] Inventors: Kunio Nishihara, Yokohama; Yoichi Hosono, Hiratsuka; Takayuki Ishikawa, Kamakura, all of Japan

[73] Assignee: Mitsui Toatsu Chemicals, Inc., Tokyo, Japan

[21] Appl. No.: 798,958

[22] Filed: Nov. 27, 1991

[30] Foreign Application Priority Data

Nov. 29, 1990 [JP] Japan ................. 2-325753

[51] Int. Cl.$^5$ .............................................. H05K 1/00
[52] U.S. Cl. .................................... 174/254; 174/259; 361/779; 361/749
[58] Field of Search .............. 174/250, 255, 259, 254; 361/411, 410, 412, 414, 416; 357/70, 71, 74, 75

[56] References Cited

U.S. PATENT DOCUMENTS

| | | | |
|---|---|---|---|
| 2,923,860 | 2/1960 | Miller | 174/262 X |
| 3,259,805 | 7/1966 | Osipchak et al. | |
| 3,409,732 | 11/1968 | Dahlgren et al. | |
| 4,677,252 | 6/1987 | Takahashi et al. | 361/411 X |
| 4,679,122 | 7/1987 | Belke, Jr. et al. | |
| 4,839,232 | 6/1989 | Morita et al. | |
| 5,041,847 | 8/1991 | Matsumoto et al. | 346/76 PH |
| 5,067,004 | 11/1991 | Marshall et al. | 357/71 |
| 5,068,708 | 11/1991 | Newman | 357/71 X |
| 5,077,595 | 12/1991 | Fukunaga | 357/75 X |
| 5,084,124 | 1/1992 | Taniguchi | 174/259 X |
| 5,130,768 | 7/1992 | Wu et al. | 357/75 X |

FOREIGN PATENT DOCUMENTS

| | | |
|---|---|---|
| 2724399 | 11/1978 | Fed. Rep. of Germany . |
| 60-32387 | 2/1985 | Japan . |
| 61-226995 | 10/1986 | Japan . |
| 2-24394 | 5/1990 | Japan . |
| 2-24395 | 5/1990 | Japan . |
| 2-25779 | 6/1990 | Japan . |

Primary Examiner—Leo P. Picard
Assistant Examiner—Cheryl R. Figlin
Attorney, Agent, or Firm—Burns, Doane, Swecker & Mathis

[57] ABSTRACT

A flexible circuit board including a flexible substrate having an insulating polyimide sheet and a wiring pattern portion formed in a mounting portion and a wiring pattern portion formed in a connecting portion, and a metal substrate on which only the mounting portion of the flexible substrate is secured by means of a thermoplastic polyimide film. Electronic devices are mounted on the mounting portion of the flexible substrate and heat generated by the electric devices can be effectively dissipated through the metal substrate. The connecting portion of the flexible substrate can be connected to an external circuit by means of a connector provided at an edge of the connecting portion. Since the connecting portion is not secured to the metal substrate, connector pins having a large mechanical strength can be used and the connecting portion can be bent at will.

13 Claims, 10 Drawing Sheets

FIG_1
*PRIOR ART*

FIG_2
*PRIOR ART*

FIG_5

FIG_10A

FIG_10B

FIG_10C

FIG_10D

FLEXIBLE PRINTED CIRCUIT BOARD HAVING A METAL SUBSTRATE

BACKGROUND OF THE INVENTION

1. Field of the Invention

The present invention relates to a flexible circuit board, and more particularly to a flexible circuit board comprising a flexible insulating sheet and a metal substrate on which said insulating sheet is applied by means of a thermoplastic polyimide layer.

2. Description of the Related Art

Recently, it has been required to dissipate effectively heat generated from electronic or electric devices provided on a printed circuit board in accordance with the increase in the number of electronic devices and the use of high power semiconductor devices. Therefore, in the case of mounting high power semiconductor devices at a high density or in a hybrid IC, it has been proposed to use a substrate made of ceramics. In order to connect the semiconductor elements and devices mounted on the printed circuit board to an external circuit, there have been widely used connector pins of such a type that the printed circuit board is clamped by the pins at its peripheral portion from front and rear surfaces. Such connector pins have a large mechanical strength and could hardly be damaged even if an external force is applied thereto, so that it is possible to attain a very high reliability in the electrical connection.

The packing density of the printed circuit board and the power of semiconductor devices have become higher and higher, and a substrate made of metal has been used in the print circuit board, the heat dissipating property of the metal substrate being superior to that of the ceramic substrate. In Japanese Patent Application Laid-open Publication Kokai Sho 61-226995 and Japanese Patent Publications Nos. 2-24394, 2-24395 and 2-25779, there nave been proposed several known flexible circuit boards using a metal substrate.

In the known flexible circuit board including the metal substrate, the metal substrate is exposed on the rear surface, and thus when the above mentioned connector pins of such a type that the flexible circuit board is clamped by the connector pins from the front and rear surfaces are used, all the connector pins would be short-circuited by means of the metal substrate, so that such connector pins having a large mechanical strength could not be utilized. In the known flexible circuit boards, there have been used surface mounting type pins.

Figure 1:
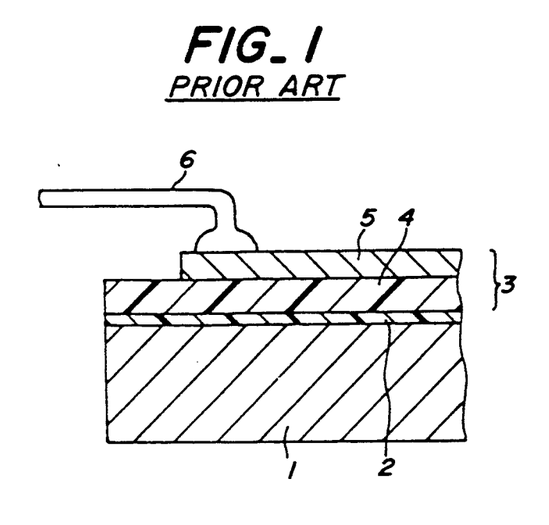
FIG. 1 is a cross, sectional view showing a first example of a known flexible circuit board having a metal substrate.

FIG. 1 is a cross sectional view showing an example of the known flexible circuit board in which the surface mounting type pins are used. On a metal substrate 1 a flexible substrate 3 is secured by means of an adhesive layer 2. The flexible substrate 3 comprises a flexible insulating sheet 4 and a wiring pattern 5 having a predetermined configuration and formed on one surface of the metal sheet. An edge of the wiring pattern 5 is retarded inwardly from an edge of the flexible substrate 3 so that a distance between the metal pattern 5 and the metal substrate 1 measured along the surface of the flexible circuit board can be increased. On a surface of the wiring pattern 5 near its edge, a tip of a pin 6 is secured by soldering. In the known flexible circuit board including the metal substrate, the metal substrate 1 and the flexible substrate 3 is secured to each other by means of the adhesive agent layer such as an epoxy type adhesive agent. Such an epoxy type adhesive agent has a problem of heat resistance and the flexible circuit board might be peeled off the metal substrate 1 during the wire bonding for connecting bare semiconductor chips to the wiring pattern 5 or during the usage of the flexible circuit board under a high temperature. In order to remove such a drawback, in Japanese Patent Application Laid-open Publication Kokai Sho 61-226995, it has been proposed to adhere the flexible circuit substrate to the metal substrate by means of a thermoplastic polyimide film which has a self-adhesive property.

Figure 2:
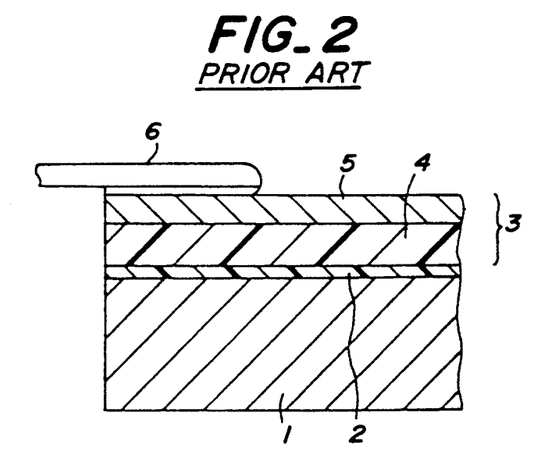
FIG. 2 is cross sectional view illustrating another example of a known flexible circuit board.

FIG. 2 is a cross sectional view illustrating another example of the known flexible circuit board having a metal substrate. In this example, a tip of a pin 6 is extended along a surface of a wiring pattern 5 of a flexible substrate 3 which is secured to a metal substrate 1 by means of an adhesive layer 2, and is connected to the wiring pattern 5 by soldering.

In the known flexible circuit board, the pin of the surface mounting type is connected to the surface of the wiring pattern by soldering. During the mounting operation of the electronic devices such as chip devices and semiconductor bear chips onto the flexible circuit board or after the mounting operation, when the external force is applied to the pin, the flexible substrate might be peeled off the metal substrate and the reliability of the connection is lost. In the known flexible circuit board shown in FIG. 2, since the pin is connected to the wiring pattern over a relatively long length so that the concentration of the external force is mitigated. But in this case, the distance between the pin and the metal substrate measured along the surface becomes short and the pins might be short-circuited via the metal substrate.

Moreover, in the known flexible circuit board having the metal substrate, the metal substrate and flexible substrate have the same configuration and are adhered to each other over their entire surfaces. Therefore, the freedom in bending is limited by the metal substrate and the application of the flexible circuit board is restricted. Further, the known flexible circuit board is connected to an external circuit by means of the surface mounting type pins, and thus a plurality of flexible circuit boards could not be easily stacked one on the other to form a laminated unit body.

SUMMARY OF THE INVENTION

The present invention has for its object to provide a novel and useful flexible circuit board in which the above mentioned drawbacks of the known flexible circuit board can be avoided, highly reliable electrical connection can be obtained, freedom in bending can be attained lamination is possible even though a metal substrate having an excellent heat dissipating property is used.

According to the invention, a flexible circuit board comprises:

a metal substrate having a surface;

at least one flexible substrate including a flexible insulating sheet, a first wiring pattern portion formed on a part of the insulating sheet which constitutes a mounting portion for mounting electric devices on the flexible circuit board, and a second wiring pattern portion formed on the remaining portion of said insulating sheet which constitutes at least one connecting portion for connecting the flexible circuit board to an external circuit; and at least one insulating thermoplastic resin film having a self-adhesive property and inserted between said mounting portion of the flexible substrate and said surface of the metal substrate.

In the flexible circuit board according to the invention, the electronic device mounting portion of the flexible substrate is secured to the metal substrate having an excellent heat dissipating property, and therefore heat generated by electronic devices provide on the mounting portion can be effectively dissipated via the metal substrate and the electronic devices can be protected against the overheating. Thus, a large number of electronic devices including high power semiconductor elements can be mounted on the flexible circuit board at a high packing density.

Moreover, since the connecting portion of the flexible substrate is not connected to the metal substrate, it is possible to use connector pins having high mechanical strength to increase the reliability in the electrical connection, and freedom in bending can be attained and thus the flexible circuit board according to the invention can be used in numerous applications.

Furthermore, the flexible substrate is divided into the mounting portion and the connecting portion and only the mounting portion is secured to the metal substrate, so that when a plurality of flexible circuit boards are laminated to form a single body, the connecting portions can be extended independently from one another and the connection to external circuits can be effected easily. In this case, a plurality of connecting portions may be extended in the same direction or in different directions in accordance with particular applications.

The present invention also relates to a method of manufacturing a flexible circuit board having a metal substrate and has for its object to provide a novel and useful method of manufacturing the above mentioned novel flexible circuit board in a simple manner.

According to the invention, a method of manufacturing a flexible circuit board having a metal substrate, a flexible substrate which includes a flexible insulating sheet, a first wiring pattern portion formed on a part of the insulating sheet which constitutes a mounting portion for mounting at least one electric device, and a second wiring pattern portion formed on the remaining portion of said insulating sheet which constitutes a connecting portion for connecting the flexible circuit board to an external circuit, and an insulating thermoplastic resin film having a self-adhesive property arranged between said mounting portion of the flexible substrate and said metal substrate, comprising the steps of:

providing an insulating sheet on a surface of a metal foil;

selectively etching the metal foil in accordance with a desired pattern to form said flexible substrate having said first wiring pattern in the mounting portion and the second wiring pattern portion in the connecting portion;

stacking said flexible substrate on the metal substrate such that only said mounting portion is placed on the metal substrate by interposing the insulating thermoplastic resin film therebetween; and pressing and heating an assembly of said flexible substrate and metal substrate to secure said mounting portion of the flexible substrate to said metal substrate by means of said insulating thermoplastic resin film.

According to a further aspect of the invention, a method of manufacturing a flexible circuit board having a metal substrate, a flexible substrate which includes a flexible insulating sheet, a first wiring pattern portion formed on a part of the insulating sheet which constitutes a mounting portion for mounting at least one electric device, and a second wiring pattern portion formed on the remaining portion of said insulating sheet which constitutes a connecting portion for connecting the flexible circuit board to an external circuit, and an insulating thermoplastic resin film having a self-adhesive property arranged between said mounting portion of the flexible substrate and said metal substrate, comprising the steps of:

providing an insulating sheet on a surface of a metal foil;

stacking said insulating sheet on the metal substrate such that only said mounting portion of the flexible substrate is placed on the metal substrate by interposing the insulating thermoplastic resin film therebetween; and pressing and heating an assembly of said insulating sheet with the metal foil and metal substrate to secure said mounting portion of the flexible substrate to said metal substrate by means of said insulating thermoplastic resin film; and selectively etching the metal foil in accordance with a desired pattern to form said first wiring pattern in the mounting portion and the second wiring pattern portion in the connecting portion.

DESCRIPTION OF THE PREFERRED EMBODIMENTS

Figure 3A:
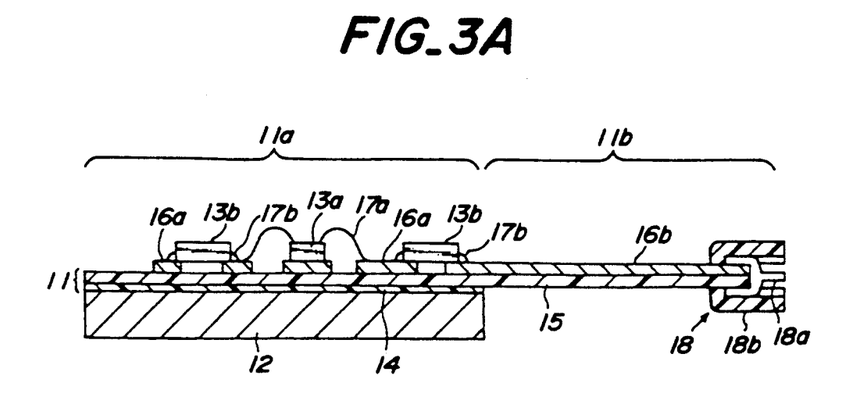
FIGS. 3A and 3B are cross sectional and plan views, respectively depicting a first embodiment of the flexible circuit board according to the invention.
Figure 3B:
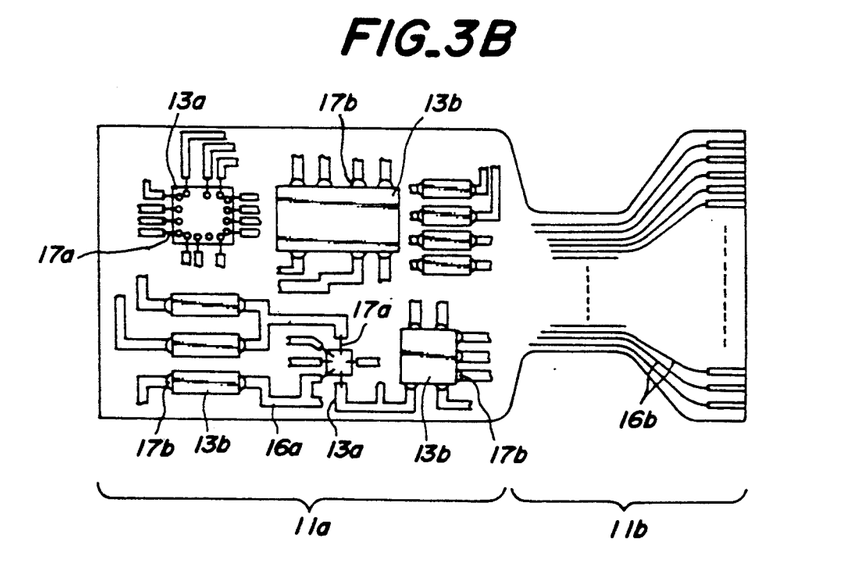

FIGS. 3A and 3B are cross sectional and plan views, respectively showing a first embodiment of the flexible circuit board according to the invention. The flexible circuit board of the present embodiment comprises a flexible substrate 11 and a metal substrate 12. The flexible substrate 11 is divided into a mounting portion 11a for mounting electric devices such as semiconductor chips (bare chips) 13a and chip devices 13b thereon and a connecting portion 11b for connecting the flexible circuit board to an external circuit. According to the invention, only the mounting portion 11a of the flexible substrate 11 is secured to the metal substrate 12 by means of a thermoplastic polyimide layer 14. The thermoplastic polyimide layer 14 used in this embodiment is preferably formed by a resin having an imide construction within the molecular skeleton and having a glass transition temperature not lower than 160° C. and not higher than 300° C. When use is made of a resin having a glass transition temperature lower than 160° C., the reliability under high temperature becomes low and when a resin having a glass transition temperature higher than 300° C is used, the adhesive force becomes weak. Since the thermoplastic polyimide layer 14 has a self-adhesive property, it is possible to adhere the flexible substrate 11 to the metal substrate easily by heating them at a temperature above the glass transition temperature with the aid of a heat press or a heat laminate roll without using any other adhesive agent. In the present embodiment, the metal substrate 12 is made of copper, but it may be made of iron, aluminum, alumite, stainless steel, silicon steel, molybdenum, 42 alloy and nickel silver.

The flexible substrate 11 comprises an insulating sheet 15 made of polyimide resin and a wiring pattern having a given configuration. The wiring pattern is formed by selectively etching a copper foil applied on the insulating sheet 15. The wiring pattern is divided into a first wiring pattern portion 16a formed in the mounting portion 11a and a second wiring pattern portion 16b formed in the connecting portion 11b. The first wiring pattern portion 16a and the bare semiconductor chips 13a are connected by means of bonding wires 17a, and the second wiring pattern portion 16b and the chip devices 13b are connected by solderings 17b. The second wiring pattern portion 16b formed in the connecting portion 11b is extended up to an edge of the connecting portion. A plurality of conductors of the wiring pattern are aligned at a given pitch along the edge of the connecting portion 11b of the flexible substrate 11.

In order to connect the portion of wiring pattern 16b extending to the edge of the connecting portion 11b of the flexible substrate 11 to an external circuit, a connector 18 is provided at the edge of the flexible substrate 11 as shown in FIG. 3A. For the sake of simplicity, the connector 18 is not shown in FIG. 3B. The connector 18 comprises connector pins 18a of such a type that the flexible substrate 11 is clamped by the pin from front and rear surfaces thereof, and an insulating housing 18b. In this manner, according to the present invention, although the connector pins 18a having a very strong mechanical strength are used, they are not short-circuited to each other, and further a distance between the pins and the metal substrate 12 can be made long, because the metal substrate is not existent in the connecting portion 11b. In this manner, the reliability of the electrical connection can be improved. Moreover, the connecting portion 11b of the flexible substrate 11 can be bent freely and thus the freedom for arranging the flexible circuit board relative to the external circuits can be increased. It should be noted that according to the invention, the second wiring pattern portion 16b may be connected to the connector pins 18a by utilizing one of known various connecting modes. Further, the conductors of the second wiring pattern portion 16b at the edge of the connecting portion 11b may be soldered to conductors of a wiring pattern of an external flexible circuit board without using connector pins.

In one method of manufacturing the above mentioned flexible circuit board according to the invention, after the polyimide sheet 15 has been directly applied on a copper foil, the copper foil is selectively etched to form the first and second wiring pattern portions 16a and 16b having the desired configuration. Then, the thermoplastic polyimide film 14 is formed by applying polyamic acid to a surface of the metal substrate 12 and heating to conduct the imidization. Finally the mounting portion 11a of the flexible substrate 11 is placed on the metal substrate 12 and is heated under pressure. In this manner, the mounting portion 11a of the flexible substrate 11 can be firmly and easily secured to the metal substrate 12.

In another method of manufacturing the flexible circuit board according to the invention, after the polyimide sheet 15 has been directly formed on one surface of a copper foil and the copper foil has been selectively etched to form the first and second wiring pattern portions 16a and 16b, the thermoplastic polyimide film 14 is applied on a surface of the polyimide sheet 15 which is opposite to a surface on which the wiring pattern has been formed. Then, only the mounting portion 11a of the flexible substrate 11 is brought into contact with the metal substrate 12 while the thermoplastic polyimide film is interposed between the polyimide sheet 15 and the metal substrate 12. Finally, the assembly is heated at a temperature higher than the glass transition temperature of the thermoplastic polyimide film 14 under pressure to adhere the flexible substrate 11 to the metal substrate 12. In this method, the thermoplastic polyimide film 14 may be applied on a surface of the mounting portion 11a of the flexible substrate 11 instead of on a whole surface thereof. Further, the first and second wiring pattern portions 16a and 16b may be covered with an insulating and flexible resist ink or a cover film except for portions at which the electronic devices are mounted on the flexible substrate 11 and a portion at which the connector is provided.

Figure 4:
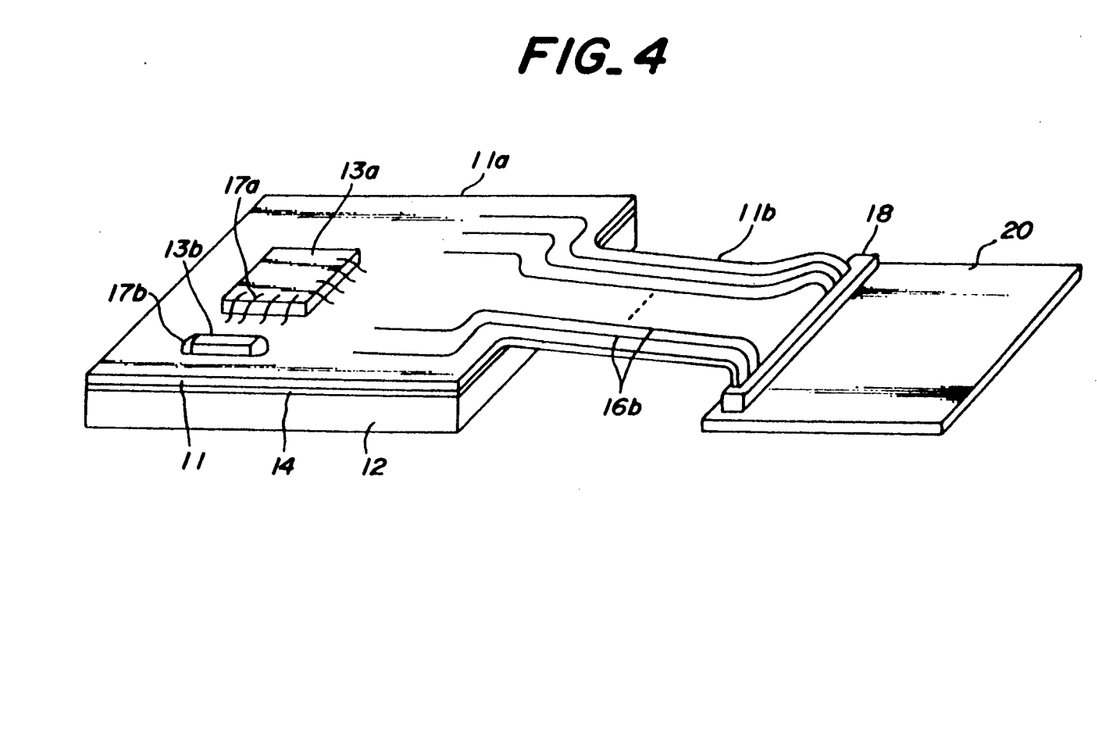
FIG. 4 is a perspective view showing the condition of connecting the flexible circuit board shown in FIGS. 3A and 3B to an external circuit.

FIG. 4 is a perspective view showing a condition in which the flexible circuit board according to the invention is connected to an external circuit board 20 by means of the connector 18 which is provided along the edge of the connecting portion 11b of the flexible substrate 11, the connecting portion being extended from the mounting portion 11a which is secured to the metal substrate 12 by means of the thermoplastic polyimide film 14. The connecting portion 11b can be positively secured to the external circuit board 20 by inserting the connector pins 18a of the connector 18 into through holes formed in the external circuit board.

Figure 5:
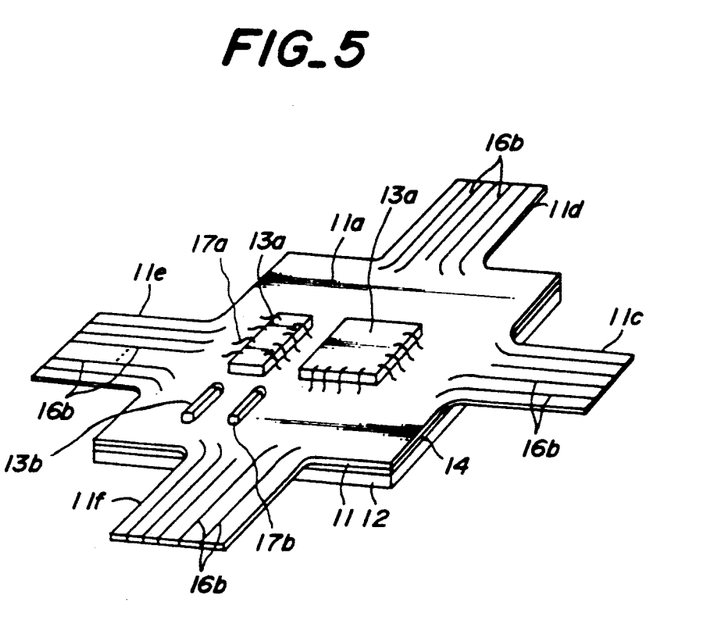
FIG. 5 is a perspective view illustrating a second embodiment of the flexible circuit board according to the invention.

FIG. 5 is a perspective view illustrating a second embodiment of the flexible circuit board according to the invention. In the present embodiment, a flexible substrate 11 comprises a single mounting portion 11a for mounting electronic devices such as semiconductor chips 13a and chip devices 13b, and four connecting portions 11c, 11d, 11e and 11f which extend from the rectangular mounting portion 11a in four mutually orthogonal directions. A polyimide sheet 15 of the flexible substrate 11 is secured to a metal substrate 12 by means of a thermoplastic polyimide film 14. At edges of the connecting portions 11c, 11d, 11e and 11f there are provided connectors similar to the connector 18 shown in FIG. 3A, but in FIG. 5 these connectors are not shown for the sake of simplicity. In the present embodiment, the total number of conductors of the second wiring pattern portions 16b can be increased or the number of conductors of each of the second wiring pattern portions can be reduced.

Figure 6:
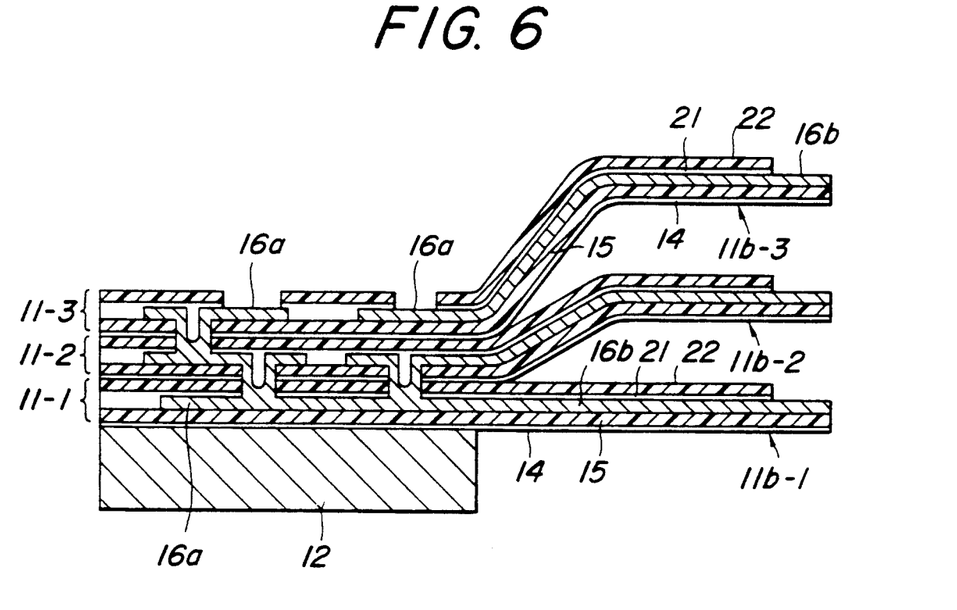
FIG. 6 is a cross sectional view depicting a third embodiment of the flexible circuit board according to the invention.

FIG. 6 is a cross sectional view showing a third embodiment of the flexible circuit board according to the invention. In the present embodiment, three flexible substrates 11-1, 11-2 and 11-3 are stacked one on the other such that mounting portions of these flexible substrates are placed on a metal substrate 12. The mounting portion of the lowest flexible substrate 11-1 is secured to the metal substrate 12 by means of a thermoplastic polyimide film 14. The construction of the flexible substrates 11-1 to 11-3 is similar to each other and each flexible substrate comprises a first polyimide sheet 15 having a thermoplastic polyimide film 14 applied on its one surface, first and second wiring pattern portions 16a and 16b formed on the other surface of the polyimide sheet 15, a second thermoplastic polyimide film 21 applied on the wiring pattern portions, and a second polyimide sheet 22 applied on the second thermoplastic polyimide film 21. The configuration of the first and second wiring pattern portions 16a and 16b of the flexible substrates 11-1 to 11-3 differ from each other. In order to connect the wiring patterns of different flexible substrates 11-1 to 11-3 to each other, the wiring patterns are connected to each other through via holes. Electronic devices 13a and 13b are mounted on the mounting portion of the uppermost flexible substrate 11-3.

Connecting portions 11b-1, 11b-2 and 11b-3 of the flexible substrates 11-1, 11-2 and 11-3 are not laminated each other and are extended independently from each other. The construction of these connecting portions 11b-1 to 11b-3 is similar to each other except for the configuration of the second wiring patter portions 16b. In each of the connecting portions 11b-1 to 11b-3, the second thermoplastic polyimide film 21 and second polyimide sheet 22 are not extended up to the edge of the connecting portion so that conductors of the wiring pattern portion 16b are exposed at the edge portion.

Figure 7:
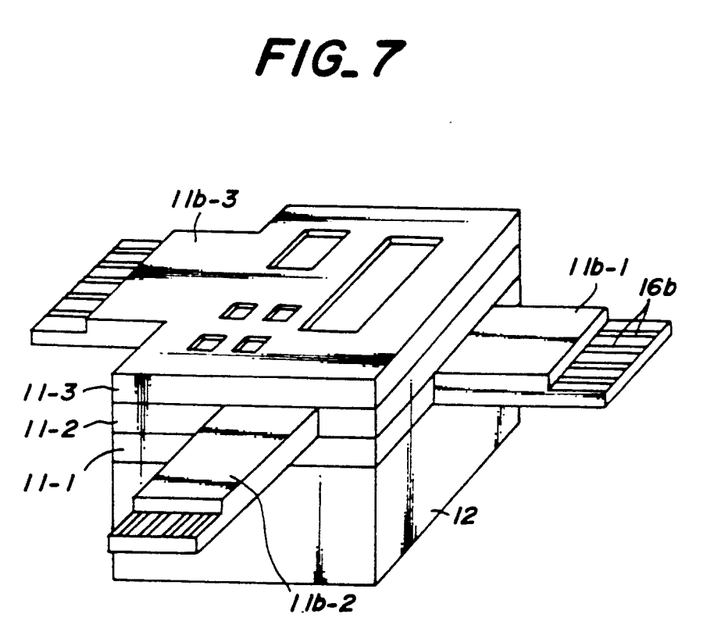
FIG. 7 is a perspective view illustrating a fourth embodiment of the flexible circuit board according to the invention.

FIG. 7 is a perspective view depicting a fourth embodiment of the flexible circuit board according to the present invention. In the third embodiment shown in FIG. 6, the connecting portions 11b-1 to 11b-3 of the flexible substrates 11-1 to 11-3 are extended from the mounting portions in the same direction. In the present embodiment, each of connecting portions 11b-1 to 11b-3 is extended from each of three sides of rectangular mounting portions. This construction is particularly suitable for connecting the flexible circuit board to different external circuits. In second thermoplastic film 21 and second polyimide sheet 22 of the uppermost flexible substrate 11-3 there are formed windows for mounting electronic devices.

According to the invention, the electronic devices may be mounted not only on the uppermost flexible substrate 11-3, but also may be mounted within the lower flexible substrates 11-1 and 11-2. In this case, after one or more electronic devices have been mounted on the first wiring pattern portion 16a of the lower flexible substrate, the second polyimide sheet 22 is applied via the second thermoplastic polyimide film 21 having a large thickness such that the electronic devices are embedded within the second thermoplastic polyimide film. Further the wiring patterns of the flexible substrates 11-1 to 11-3 are connected to each other by means of holes. In this case, the electronic devices embedded in the lower flexible substrates 11-1 and 11-2 are preferably thin and have good heat resistance.

Furthermore, according to the invention, wiring patterns may be provided on opposite surfaces of an insulating sheet such as the polyimide sheet to form a flexible substrate, and then a mounting portion of such a flexible substrate may be secured to a metal substrate by means of an insulating thermoplastic resin film such as the thermoplastic polyimide film.

Now several methods of manufacturing the flexible circuit board shown in FIGS. 3A and 3B will be explained.

Figure 8A:
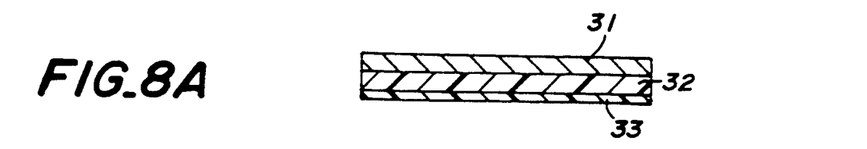
FIGS. 8A to 8D are cross sectional views representing successive steps for manufacturing the flexible circuit board according to the invention.

As illustrated in FIG. 8A, on one surface of a copper foil 31 having a thickness of 9 to 200 microns is applied a polyimide sheet 32 having a thickness of several microns to several hundred microns which is formed by a casting method. On a surface of this polyimide sheet 32 is applied a thermoplastic polyimide film 33 having a thickness of 1 to 20 microns.

Figure 8B:
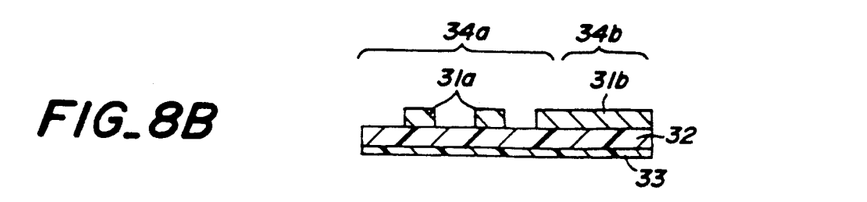

Then, the copper foil 31 is selectively etched in accordance with a desired pattern to form simultaneously first and second wiring pattern portions 31a and 31b as shown in FIG. 8B. In this case, the first and second wiring pattern portions 31a and 31b are formed such that they are located in mounting and connecting portions 34a and 34b, respectively.

Figure 8C:
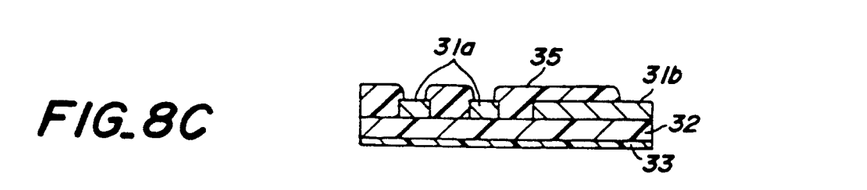

Next, as illustrated in FIG. 8C, a flexible resist ink or cover sheet 35 having a thickness of 20 to 200 microns is formed on the wiring pattern portions 31a and 31b by applying a thermoplastic polyimide layer. In FIGS. 3 and 4 such a cover sheet 35 is not shown. It should be noted that the cover sheet 35 is not formed at portions at which the electronic devices are to be mounted and at a portion at which the connector is to be provided.

Figure 8D:
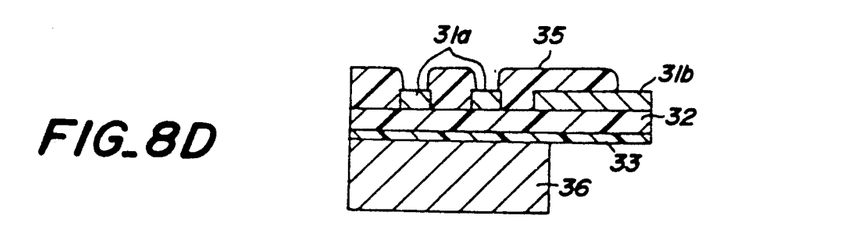

Finally, the mounting portion 34a of the flexible circuit board is placed on a metal substrate 36 having a thickness of 0.05 to 4 mm as shown in FIG. 8D. Then, an assembly of the flexible substrate and the metal substrate is pressed, while it is heated at a temperature which is higher than a glass transition temperature of the thermoplastic polyimide film 33 to form the flexible circuit board according to the invention. In the present embodiment, the polyimide sheet 32 is directly applied to the copper foil 31, but a thermoplastic polyimide film having a thickness of 1 to 20 microns may be interposed therebetween.

Figure 9A:
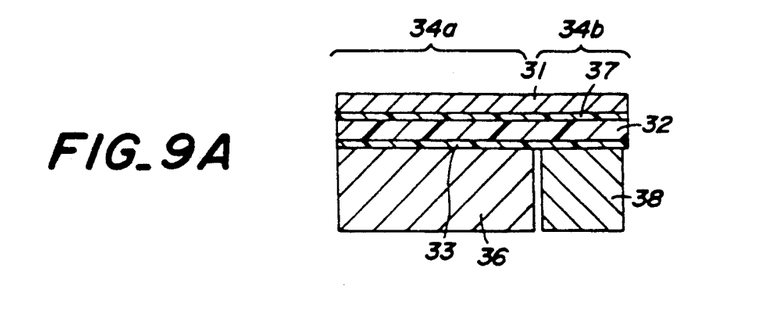
FIGS. 9A to 9C are cross sectional views illustrating successive steps for manufacturing the flexible circuit board according to the invention.

FIGS. 9A to 9C depict another embodiment of the method of manufacturing the flexible circuit board according to the invention. In the present embodiment, after the polyimide sheet 32 and thermoplastic polyimide film 33 have been applied on the copper foil 31 as shown in FIG. 8A, a mounting portion 34a is secured to the metal substrate 36 by a heat press as shown in FIG. 9A. During this step, a back-up block 38 having the same thickness as the metal substrate 36 is placed underneath a connecting portion 34b. However, the copper foil 31 and polyimide sheet 32 are not secured to the back-up block 38.

Figure 9B:
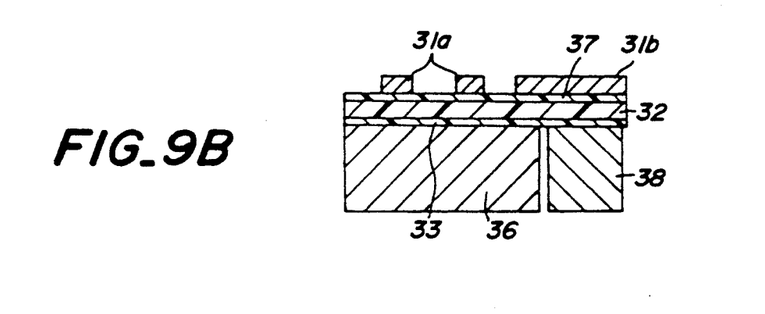

Then, the copper foil 31 is selectively etched to form simultaneously a first wiring pattern portion 31a in the mounting portion 34a and a second wiring pattern portion 31b in the connecting portion 34b as illustrated in FIG. 9B.

Figure 9C:
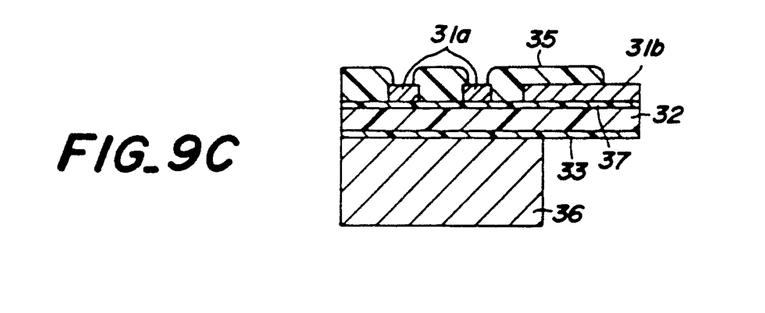

Finally, the cover sheet 35 is formed on the flexible substrate 34 as shown in FIG. 9C. After all the necessary steps have been done, the back-up block 38 is removed.

Figure 10A:
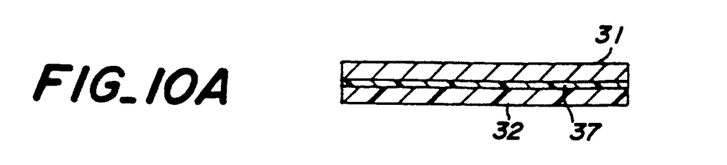
FIGS. 10A to 10D are cross sectional views depicting successive steps for manufacturing the flexible circuit board according to the invention.
Figure 10B:
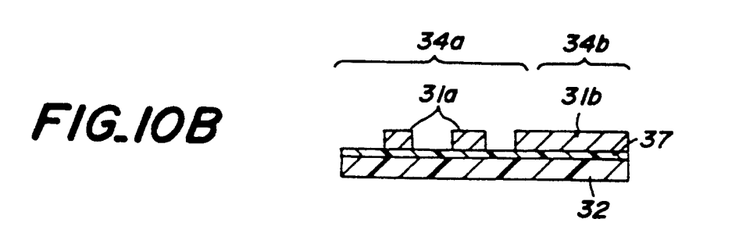

FIGS. 10A to 10D represent still another embodiment of the method of manufacturing the flexible circuit board according to the invention. In the present embodiment. As illustrated in FIG. 10A, on a surface of a copper foil 31 is secured a polyimide sheet 32 by means of a thermoplastic polyimide film 37 by the heat press or heat laminating roller. Then, the copper foil 31 is selectively etched to form simultaneously a wiring pattern portion 31a in a mounting portion 34a and a wiring portion 31b in a connecting portion 34b as illustrated in FIG. 10B.

Figure 10C:
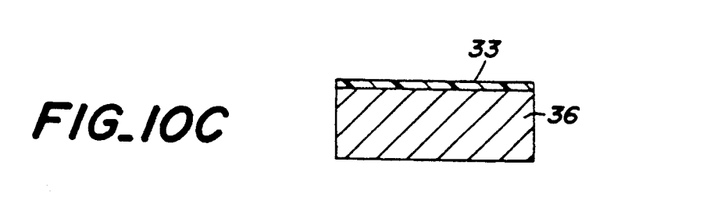
Figure 10D:
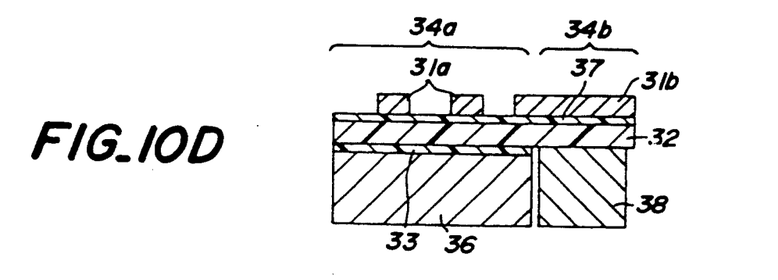

At the same time, a metal substrate 36 having a thermoplastic polyimide film 33 applied thereon is prepared. Then, the mounting portion 34a of the flexible substrate is placed on the metal substrate 36 via the thermoplastic polyimide film 33 and an assembly is secured to each other by the heat press. In an alternate embodiment, the polyimide sheet 32 may be directly formed on the copper foil 31 and a cover sheet may be provided on the copper foil after the wiring pattern portions 31a and 31b have been formed.

Figure 11A:
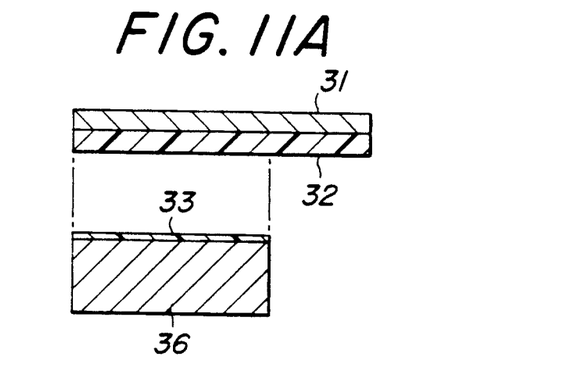
FIGS. 11A to 11D are cross sectional views showing successive steps of manufacturing the flexible circuit board according to the invention.
Figure 11B:
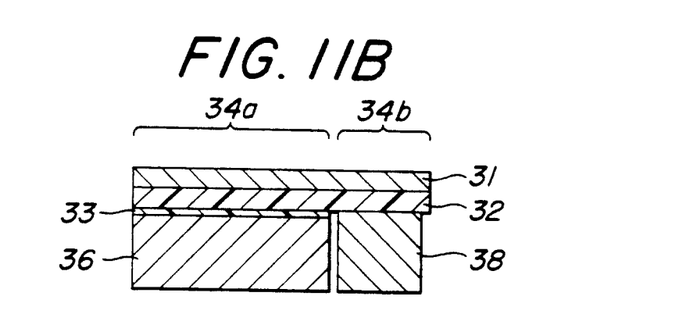
Figure 11C:
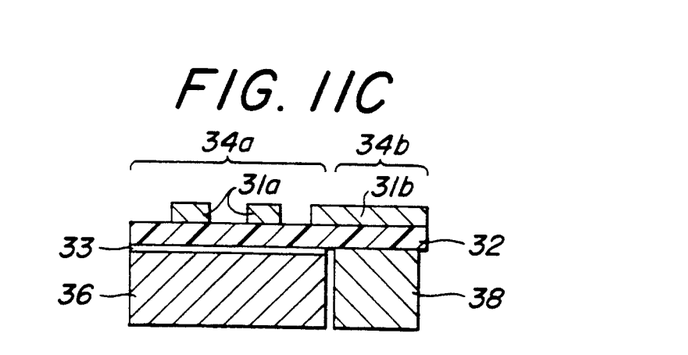

FIGS. 11A to 11D show still another embodiment of the method of manufacturing the flexible circuit board according to the invention. In the present embodiment, as shown in FIG. 11A, an assembly of a copper foil 31 and a polyimide sheet 32 applied on one surface of the copper foil and an assembly of a metal substrate 36 and a thermoplastic polyimide film 33 applied on one surface of the metal substrate are prepared. Then, these assemblies are stacked one on the other, while a back-up block 38 is used as shown in FIG. 11B. In this case, a mounting portion 34a is placed on the metal substrate 36 and a connecting portion 34b is placed on the back-up block 38. Then, the assemblies are adhered with each other by a heat press.

Figure 11D:
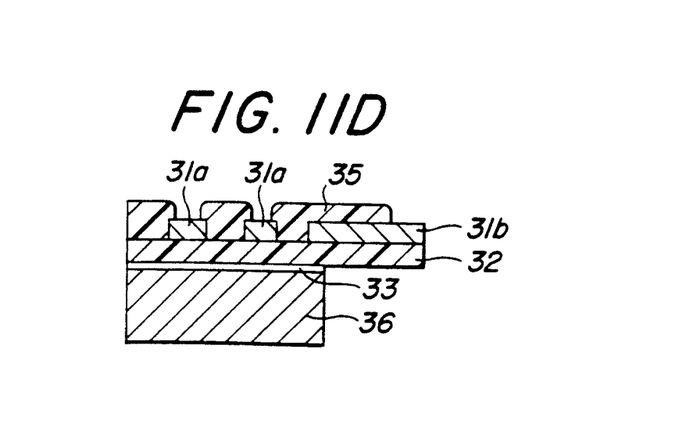

Next, the copper foil 31 is selectively etched to form a first wiring pattern portion 31a in the mounting portion 34a and a second wiring pattern portion 31b in the connecting portion 34b as shown in FIG. 11D. Finally, a cover sheet 35 is applied on the copper foil 31 except for portions at which electric devices and the connector are to be provided.

The present invention is not limited to the above mentioned embodiments, but many modifications and alternations may be conceived by those skilled in the art within the scope of the invention. For instance, in the above embodiments, the insulating sheet of the flexible substrate is made of polyimide, but it may be made of liquid crystal polymer having a high glass transition temperature or polyether ether ketone resin. Further, in the above explained embodiments, the mounting portion of the flexible substrate and the metal substrate are adhered to each other by means of the insulating thermoplastic resin made of thermoplastic polyimide resin, but the insulating thermoplastic resin film may be made of liquid crystal polymer having a low glass transition temperature, polyether sulfonamide resin, polyether ether ketone resin, polyamide-imide resin, polyamide resin, polyparabanic acid resin and polyacetal resin.

Moreover, in the above embodiments, one or more mounting portions of flexible substrates are secured to only one surface of the metal substrate, but onto respective surfaces of the metal substrate, one or more mounting portions of flexible substrates may be secured. In this case, connecting portions of these flexible substrates may be extended in the same direction or in different directions.

Further, after the electronic devices have been mounted on the flexible circuit board, a polyimide sheet may be applied on the the flexible circuit board by means of a thermoplastic polyimide film.

As explained above in detail, in the flexible circuit board according to the invention, since only the mounting portion of the flexible substrate is secured to the metal substrate, it is possible to use connector pins having a high mechanical strength, so that the reliability of the electrical connection can be improved, although a metal substrate having the good heat dissipating property is used. Further the connecting portion of the flexible substrate is not secured to the metal substrate, and thus the connecting portion can be bent at will. Therefore, the freedom in arranging the flexible circuit board can be increased and its field of application is widened. Moreover, the connector pins are not provided on the mounting portion of the flexible substrate, so that a plurality of flexible substrates can be easily stacked on one another to form a laminated unit body. In this case, the connecting portions of the flexible substrates can be extended from the laminated mounting portions in any desired directions, and therefore the freedom in arranging the external circuits may be also increased.

What is claimed is:

1. A flexible circuit board comprising:
    a metal substrate having a surface;
    at least one flexible substrate including a flexible insulating sheet, a first wiring pattern portion formed on a part of the insulating sheet which constitutes a mounting portion for mounting electric devices on the flexible circuit board and a second wiring pattern portion having contact pads on an edge and formed on the remaining portion of said insulating sheet which constitutes at least one connecting portion for connecting the flexible circuit board to an external circuit wherein only the mounting portion is located on the metal substrate; and
    at least one insulating thermoplastic resin film having a self-adhesive property and inserted between said mounting portion of the flexible substrate and said surface of the metal substrate.

2. A flexible circuit board according to claim 1, wherein said insulating thermoplastic resin film is provided exclusively on said surface of the metal substrate.

3. A flexible circuit board according to claim 1, wherein said insulating thermoplastic resin film is provided on a whole surface of said insulating sheet which is opposite to a surface on which said first and second wiring pattern portions are formed.

4. A flexible circuit board according to claim 1, wherein said flexible substrate further comprises a second insulating thermoplastic film provided between said insulating sheet and said first and second wiring pattern portions.

5. A flexible circuit board according to claim 1, wherein said flexible substrate comprises a plurality of connecting portions which are extended separately from each other from said mounting portion of the flexible substrate.

6. A flexible circuit board according to claim 5, wherein said plurality of connecting portions are extended in the same direction viewed in a direction perpendicular to a plane of the flexible circuit board.

7. A flexible circuit board according to claim 5, wherein said plurality of connecting portions are extended in different directions viewed in a direction perpendicular to a plane of the flexible circuit board.

8. A flexible circuit board according to claim 5, the first wiring pattern portions of said plurality of flexible substrates are electrically connected to each other by means of via holes.

9. A flexible circuit board according to claim 1, wherein said insulating sheet of the flexible substrate is made of material selected from a group consisting of polyimide resin, liquid crystal polymer and polyether ether ketone resin.

10. A flexible circuit board according to claim 1, wherein said insulating thermoplastic resin film is made of material selected from a group consisting of thermoplastic polyimide resin, liquid crystal polymer, polyether sulfonamide resin, polyether ether ketone resin, polyamide-imide resin, polyamide resin, polyparabanic acid resin and polyacetal resin.

11. A flexible circuit board according to claim 1, wherein said flexible substrate further comprises an insulating protection film applied on said first and second wiring pattern portions except for portions at which the electronic devices and a connector are to be provided.

12. A flexible circuit board according to claim 1, wherein said metal substrate is formed by a metal sheet having a thickness of 0.05 to 4 mm, said insulating sheet is formed by a polyimide resin sheet having a thickness of several microns to several hundred microns, said first and second wiring pattern portions are formed by etching a copper foil having a thickness of 9 to 200 microns, and said insulating thermoplastic resin film is formed by a thermoplastic polyimide film having a thickness of 1 to 20 microns.

13. A flexible circuit board according to claim 1, wherein said metal substrate is made of material selected from a group consisting of copper, iron, aluminum, alumite, stainless steel, silicon steel, molybdenum, 42 alloy and nickel silver.

* * * * *